(12) United States Patent
Le

(10) Patent No.: US 7,773,357 B2
(45) Date of Patent: Aug. 10, 2010

(54) AUTO-DETECTING CMOS INPUT CIRCUIT FOR SINGLE-VOLTAGE-SUPPLY CMOS

(75) Inventor: Hung Pham Le, San Jose, CA (US)

(73) Assignee: Exar Corporation, Fremont, CA (US)

( * ) Notice: Subject to any disclaimer, the term of this patent is extended or adjusted under 35 U.S.C. 154(b) by 381 days.

(21) Appl. No.: 12/014,072

(22) Filed: Jan. 14, 2008

(65) Prior Publication Data

US 2009/0180227 A1    Jul. 16, 2009

(51) Int. Cl.
*H02H 9/04* (2006.01)
(52) U.S. Cl. ..................................... 361/91.1
(58) Field of Classification Search ................. 361/91.1
See application file for complete search history.

(56) References Cited

U.S. PATENT DOCUMENTS

| | | | | |
|---|---|---|---|---|
| 6,411,482 B1 * | 6/2002 | Funke | ....................... | 361/91.1 |
| 7,012,794 B2 * | 3/2006 | Le | ............................ | 361/91.1 |
| 7,683,696 B1 * | 3/2010 | Le | ............................ | 327/534 |
| 2006/0072267 A1 * | 4/2006 | Chatty et al. | ............... | 361/91.1 |
| 2008/0231341 A1 * | 9/2008 | Miske | ........................ | 327/427 |

* cited by examiner

*Primary Examiner*—Stephen W Jackson
*Assistant Examiner*—Ann T Hoang
(74) *Attorney, Agent, or Firm*—Townsend and Townsend and Crew LLP

(57) ABSTRACT

An auto-detecting input circuit is operative to sustain relatively high voltages applied to an input pad and generate corresponding signal levels at a native supply voltage range. The input circuit includes floating wells, corresponding bias selectors, and input biasing transistors to ensure that no gate oxide exposed to external voltages sustains a voltage greater than a predefined value. Bias selectors select an available highest voltage to reverse bias corresponding floating wells and ensure transistors are not electrically overstressed. As input-related terminals experience switching related voltages, the bias selectors select alternate terminals to continue selection of the highest voltage available and provide correct reverse biasing conditions. A resistor and clamp generate translated output voltage levels limited to the native supply voltage range. A latch is triggered by a first input signal excursion above the native supply voltage. The latch output enables pull-down transistors to provide a correct low-level output signal.

10 Claims, 3 Drawing Sheets

AUTO-DETECTING CMOS INPUT CIRCUIT FOR SINGLE-VOLTAGE-SUPPLY CMOS

BACKGROUND OF THE INVENTION

The present invention relates to electronic circuits, and more particularly to an input circuit adapted to automatically detect relatively high voltages and operate at a native voltage level corresponding to a detected external voltage level.

An integrated circuit (IC) is often required to receive and sense input signals having higher voltage levels than a maximum native operating voltage. The native voltage level is also typically the power supply voltage level. For instance, with an IC designed for a 1.2 V supply, the inputs of internal circuits and transistors can only withstand a maximum of 1.2 V across transistor gates (i.e., across any gate oxide) without damage occurring from electrical overstress. Prior art often resorts to use of special gate constructs or voltage level shifting techniques to sense external input signals. These special techniques are used to keep the accompanying high voltage from reaching internal CMOS transistors. These techniques allow input signal voltage levels up to a maximum of two times VDD (i.e., 2.4 V may be input to a 1.2 V circuit). Any voltage higher than two times the power supply voltage requires a different (i.e., thicker) gate transistor requiring additional processing and a more expensive dual-gate, dual-power-supply CMOS process. For reference, conventional dual-gate, dual-power-supply CMOS ICs today operating at 1.2 V use 3.3 V-capable transistors and circuits to handle 3.3 V to 5 V input signals (which is even less than the two times guidelines for 3.3 V devices).

In addition to the capability of accommodating high-voltage input signals, an input circuit needs to sense the proper voltage levels for logic state 1 or "high" signaling level and a voltage level for logic state 0 or "low" signaling level corresponding to the input signal coming from a given external environment. For example, with a 1.2 V input signal, the circuit must register logic state 0 for input signals between 0.0-0.6 V and register logic state 1 for input voltage levels between 0.6 and 1.2 V. With a 3.3 V input signal, the circuit must register logic state 0 for input signal levels between 0 and 1.65 V and register logic state 1 for input signal levels between 1.65 and 3.3 V. Registering proper logic levels is even more challenging when high-level input levels range between the 1.2 V and 3.3 V regions.

What is needed is an input circuit capable of receiving operational signal levels at either a native supply voltage level or at an external signaling-voltage level that exceeds two times the native supply level. The input circuit needs to operate at these elevated external signaling-voltage levels and not have any input devices exposed to electrical overstress and oxide breakdown.

BRIEF SUMMARY OF THE INVENTION

The present invention is an auto-detecting input circuit for electrical communication with external voltage regions and associated signaling levels substantially greater than the native supply voltage level of the input circuit. The input circuit is disposed between a supply voltage terminal and a ground terminal. The input circuit has, in one embodiment, three transistors coupled in series from an input pad to a supply-voltage terminal. The three transistors may be PMOS transistors configured to electrically couple the input pad to the supply-voltage terminal. In order to withstand external voltage levels in excess of the native supply voltage level, input circuit transistors exposed to the elevated voltage levels are situated within a cascading sequence of floating wells such that no gate oxide of any transistor is exposed to greater than a predefined value, such as, for example 1.2 V.

Well-bias selectors couple to an associated floating well and provide a reverse bias voltage to the associated floating well. Since the floating wells include PMOS transistors, the corresponding well-bias selectors select a highest voltage available to provide a correct reverse bias level for the included transistors. Floating wells and well bias selectors may be, as in the present embodiment, cascaded in order that elevated voltage accommodation may be additive. Cascading of floating wells allows the input circuit to withstand external voltages in excess of two times the native supply voltage level. Well bias selectors are connected to input terminals that range in voltage according to electrical signaling on the input pad. As a signal level present on the input pad transitions from a low level, such as ground potential, to a high-level voltage the well bias selectors alternate selection of input bias in order to maintain the highest available voltage for reverse biasing the floating wells which include PMOS transistors.

DETAILED DESCRIPTION OF THE INVENTION

Figure 1:
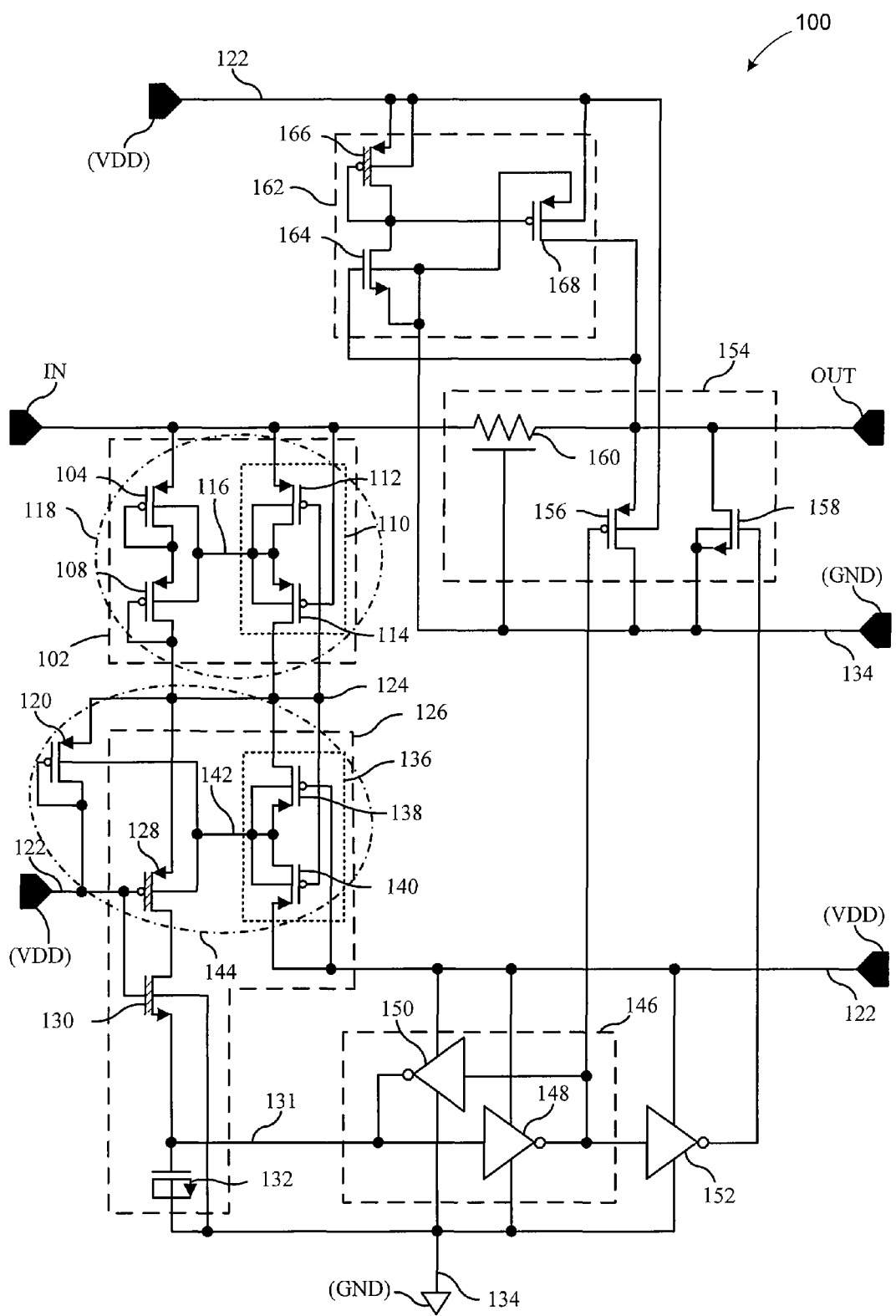
FIG. 1 is a schematic diagram of an input circuit according to one embodiment of the present invention.

FIG. 1 is a schematic diagram of an exemplary embodiment of auto-detecting input circuit 100. Input pad IN connects to detector 102, which includes transistor 104 and transistor 108. Detector 102 also includes bias selector 110, which includes transistor 112 and transistor 114. Transistor 112 and transistor 114 couple to well-bias terminal 116, which in turn couples to floating well 118. Floating well 118 is coupled to bulk terminal of transistor 104, transistor 108, transistor 112, and transistor 114.

Transistor 120 couples between supply-voltage terminal 122 and intermediate terminal 124. Trigger 126 couples to intermediate terminal 124 and includes transistor 128 and transistor 130. Transistor 130 couples to capacitor 132 which in turn couples to ground terminal 134. Trigger 126 also includes bias selector 136, which includes transistor 138 and transistor 140. Bias selector 136 couples through well-bias terminal 142 to floating well 144. Trigger 126 couples through trigger output terminal 131 to latch 146. Latch 146 includes a latch loop formed by inverter 148 and inverter 150. Inverter 152 couples to an output of latch 146.

Voltage-divider 154 couples between input pad IN and output pad OUT. Voltage-divider 154 includes transistor 156 and transistor 158, which both couple between output pad OUT and ground terminal 134. Resistor 160 couples between input pad IN, output pad OUT, and ground terminal 134. Clamp 162 couples between supply-voltage terminal 122 and output pad OUT. Clamp 162 includes transistor 164, transistor 168, and transistor 166. Transistor 164 and transistor 166 couple to transistor 168.

Auto-detecting input circuit 100 is situated, in one exemplary embodiment, as one instance of an input circuit for receiving electrical signaling from an external signaling source. Auto-detecting input circuit 100 may be one of several instances of input circuits provided in parallel to effect a bus structure to other integrated circuits. Through a bonding wire or alternate means of connection, instances of auto-detecting input circuit 100 are electrically coupled to a packaging pin or similar terminal to electrically couple to another integrated circuit. The integrated circuit that auto-detecting input circuit 100 couples to may operate at a higher voltage level for signaling. Previously, typical input circuits could maximally sustain an uppermost input signal level at about two times the supply voltage VDD supplied to the input circuit. By incorporating a cascading sequence of floating wells auto-detecting input circuit 100 is capable of sustaining voltages corresponding to input signal levels substantially in excess of two times the supply voltage VDD.

Figure 2:
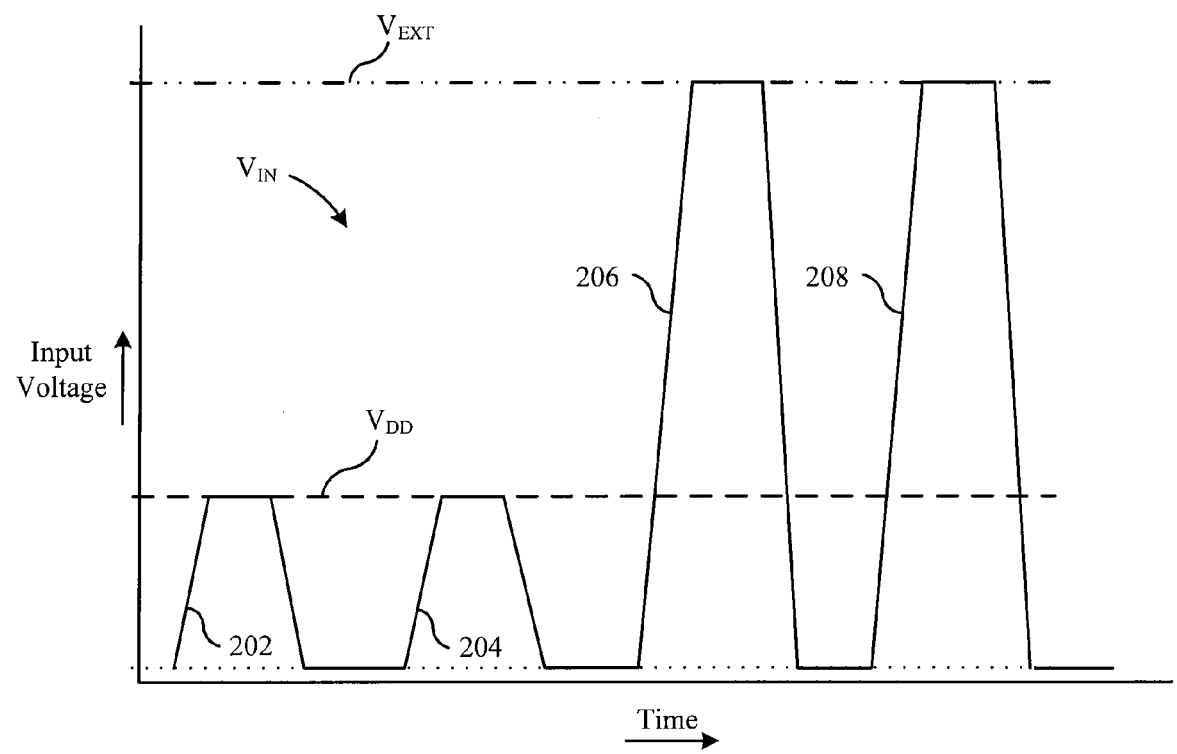
FIG. 2 is a waveform diagram of electrical characteristics of the input circuit of FIG. 1.
Figure 2:
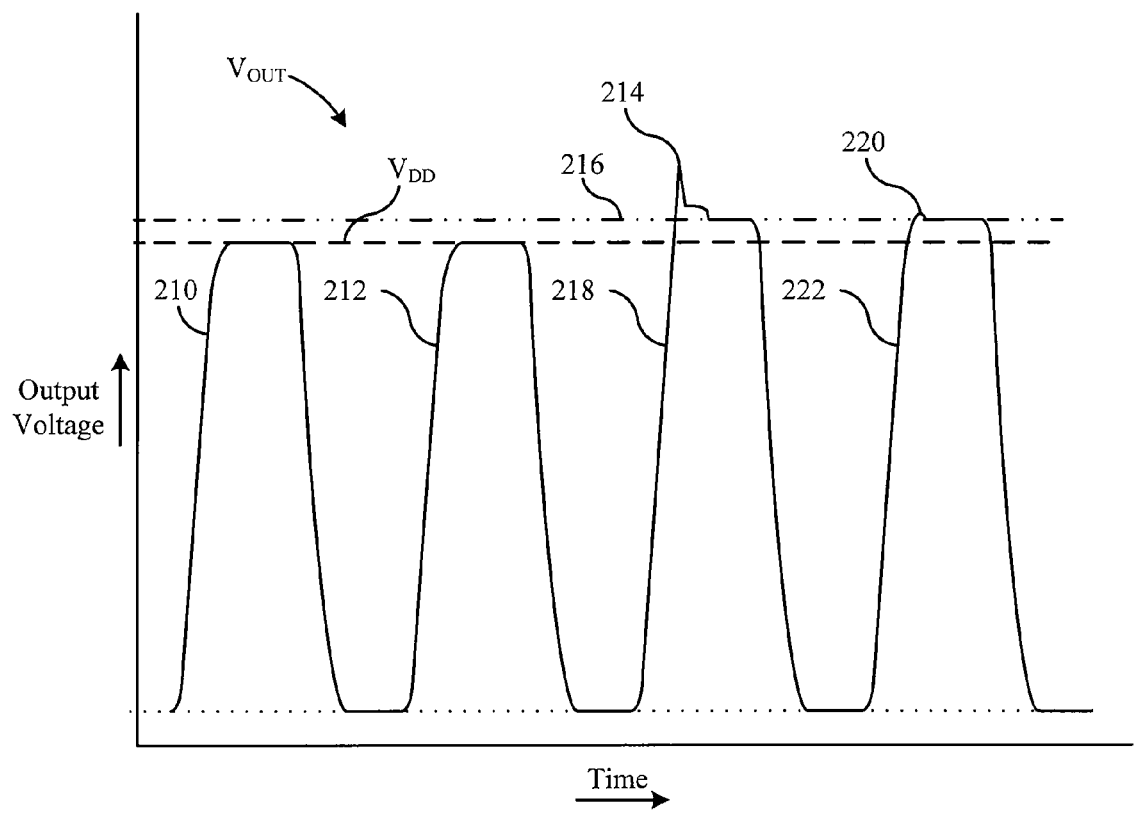

With reference to FIG. 2, for an external signaling-interface situation where input signal levels received at input pad IN vary between about 0 Volts (V) and about 1.2 V (i.e., corresponding to the supply voltage VDD on the supply-voltage terminal 122), output signal levels are generated at about the same levels at output pad OUT. For example, input voltage VIN includes input pulse 202 and input pulse 204 which are provided through resistor 160 (FIG. 1) to output pad OUT as output voltage VOUT which corresponding includes output pulse 210 and output pulse 212. Input pulse 202, input pulse 204, output pulse 210, and output pulse 212 are all operative between, for example, about 0 Volts (V) and the supply voltage VDD of about 1.2 V.

In the presence of input signaling within the voltage range of the supply voltage VDD of the auto-detecting input circuit 100, resistor 160 passes the input signaling directly to the output pad OUT with substantially no modification of the signal. Resistor 160 may be implemented, for example, with a p-type metal oxide semiconductor field-effect transistor (PMOSFET) with an on-channel resistance low enough to provide a direct linear transformation of the input signaling to output pad OUT. The gate input of resistor 160 is coupled to ground terminal 134. The resistance of resistor 160 may be, for example, 100 Ohms (Ω) to 10,000 Ω in practical applications.

For an external signal-interface situation where input signal levels received at input pad IN vary between about 0 V and about 3.3 V, auto-detecting input circuit 100 automatically detects an elevated input signaling level and triggers a transformation to signal levels ranging between about 0 V and 1.2 V on output pad OUT. For example, by automatically detecting elevated input signal levels, auto-detecting input circuit 100 provides signaling levels to the internal circuitry of the semiconductor that maintains operational voltage levels across critical device terminals such as transistor gate inputs.

Further high-logic level signaling is applied to input pad IN and received by auto-detecting input circuit 100 as a continuing portion of input voltage VIN. This portion of input voltage VIN includes input pulse 206 and input pulse 208 at an elevated external voltage VEXT. Receipt of signaling at external voltage VEXT triggers incorporation of cascading floating wells and corresponding reverse biases such that all transistors included in the floating wells are properly isolated. Cascading of floating wells and the maintaining of reverse biasing allows the external voltage on input pad IN to rise to more than two times the supply voltage VDD provided to auto-detecting input circuit 100 and not damage any transistors in the circuit.

For instance, the elevated external voltage VEXT, applied to input pad IN, produces a gate-source voltage enabling conduction through transistor 104 and transistor 108. Concurrently, the elevated external voltage is applied to a source terminal of transistor 112 and the gate terminal of transistor 114. Prior to application of the elevated external voltage, the voltage on intermediate terminal 124 is within one PMOS device threshold of supply voltage VDD (discussed below). As external voltage VEXT exceeds one PMOS device threshold above the voltage on intermediate terminal 124, transistor 112 is enabled and provides the external voltage to well-bias terminal 116 and floating well 118. With floating well 118 provided with the external voltage; transistor 104, transistor 108, transistor 112, and transistor 114 are provided with a properly isolating reverse bias voltage. This well biasing activity provides the external voltage, already present on the gate terminal of transistor 114, to well-bias terminal 116, which is coupled to the source terminal of transistor 114. With gate and source terminals at the same voltage, transistor 114 is disabled and allows the previously described well-biasing action to continue. In this way, bias selector 110 selects the greatest voltage available at either input pad IN or intermediate terminal 124 and provides that voltage to floating well 118.

Prior to any application of an elevated external voltage on input pad IN, there is no active device driving a particular voltage level on intermediate terminal 124 leaving the terminal floating. If, for any reason, the voltage level on intermediate terminal 124 drifts upward in voltage, transistor 120 receives an enabling gate-source voltage turning the device on and coupling intermediate terminal 124 to supply voltage VDD on supply-voltage terminal 122. Given the voltage selector capabilities of bias selector 110 and bias selector 136, which are each coupled to intermediate terminal 124 as well as input pad IN and supply-voltage terminal 122, the highest voltage applied to either selector is provided respectively to floating well 118 and floating well 144, ensuring that all devices contained within each well are properly reverse biased at all times. With floating well 118 and floating well 144 cascaded (i.e., with intermediate terminal 124 in common) accommodation of elevated voltages is additive on input pad IN.

As the external voltage applied to input pad IN rises above a level equal to two PMOS device thresholds, transistor 104 and transistor 108 turn on and the voltage on intermediate terminal 124 also rises. As the voltage on intermediate terminal 124 rises to one PMOS device threshold above supply voltage VDD, transistor 120 is activated and conducts. Transistor 120 is a weak device and is not capable of sinking all the current supplied from VIN through transistors 104 and 108. Therefore, transistor 120 develops a source-drain voltage drop and allows terminal 124 to rise to more than a p-channel threshold voltage Vthp above supply voltage VDD. Transistor 120 assures that terminal 124 does not, under any biasing condition, rise to any voltage that would damage devices contained in floating well 144.

As the voltage on intermediate terminal 124 rises to a level equal to or greater than one PMOS device threshold above supply voltage VDD (on supply-voltage terminal 122), transistor 128 is turned on and conducts. Additionally, as the voltage on intermediate terminal 124 exceeds one PMOS device threshold above the voltage on supply-voltage terminal 122 (i.e., supply voltage VDD), transistor 138 is enabled and provides the voltage on intermediate terminal 124 to well-bias terminal 142 and floating well 144. With floating well 144 provided with the voltage on intermediate terminal 124; transistor 138, transistor 140, transistor 128, and transistor 120 are provided with a properly isolating reverse bias voltage. This well biasing activity provides the voltage on intermediate terminal 124 present on the gate terminal of transistor 140 to well-bias terminal 142, which is coupled to the source terminal of transistor 140. Transistor 140, therefore, is disabled and allows the previously described well-biasing action to continue. In this way, bias selector 136 selects the greatest voltage available at either intermediate terminal 124 or supply-voltage terminal 122 and provides that voltage to floating well 144.

In addition to the activation of transistor 128, transistor 130, with a gate terminal coupled to supply-voltage terminal 122, is also turned on, allowing for charging of capacitor 132 to begin. As capacitor 132 charges up, the voltage on trigger output terminal 131 rises and upon reaching a logic threshold of inverter 148, triggers latch 146 through the cross coupling connections with inverter 150. With latch 146 triggered, a low-level voltage is provided to the gate terminal of transistor 156 and through inverter 152, a high-level voltage is provided to the gate terminal of transistor 158. Transistor 156 and transistor 158 are activated and conduct any time the voltage on output pad OUT is induced to rise above ground VSS on ground terminal 134.

With input pulse 206 applied to input pad IN, the voltage on output pad OUT commences to rise as shown in the first portion of output pulse 218. As the voltage on output pad OUT exceeds one NMOS device threshold above ground VSS, transistor 164 is activated and along with transistor 166 provides an activation voltage on the gate terminal of transistor 168 within clamp 162. With transistor 168 activated, as the rising voltage on output pad OUT exceeds one PMOS device threshold above supply voltage VDD, transistor 168 conducts and clamps output voltage VOUT to off-set voltage 216. In the course of activating transistor 164 and transistor 168 a trigger pulse 214 may be experienced as an artifact of the triggering process for these devices.

The application of input pulse 208 subsequent to input pulse 206, trigger pulse 220 (within output pulse 222) occurs for reasons similar to those surrounding trigger pulse 214. The magnitude of trigger pulse 220 is significantly less than the magnitude of trigger pulse 214. Trigger pulse 220 occurs after latch 146 is triggered and transistor 156 and transistor 158 are activated. Trigger pulse 220 occurs when the source (not shown) external to auto-detecting input circuit 100 has to drive output voltage VOUT against the active devices transistor 156 and transistor 158. This condition is responsible for the lower magnitude of trigger pulse 220 compared to trigger pulse 214. The conductive channels of transistor 156 and transistor 158 were not present during formation of trigger pulse 214. This is the case since the occurrence of input pulse 206 is required to set latch 146.

Subsequent to the setting of latch 146, output pulses such as output pulse 222 contain an additional pulse-like trigger pulse 220 and settle to off-set voltage 216. Off-set voltage 216 is the magnitude of voltage generated on output pad OUT due to the voltage drop across transistor 168 after being triggered to clamp to supply voltage VDD against an otherwise high-level voltage occurring on output pad OUT. Off-set voltage 216, is not of great enough magnitude to cause any reliability problem for any transistor in the circuit. Rather, off-set voltage 216 ensures linear relationship between VIN and VOUT is as close to a 1:1 ratio as possible, regardless of whether the operating voltage range of VIN is 0-1.2 V or 0-3.3 V.

Figure 3:
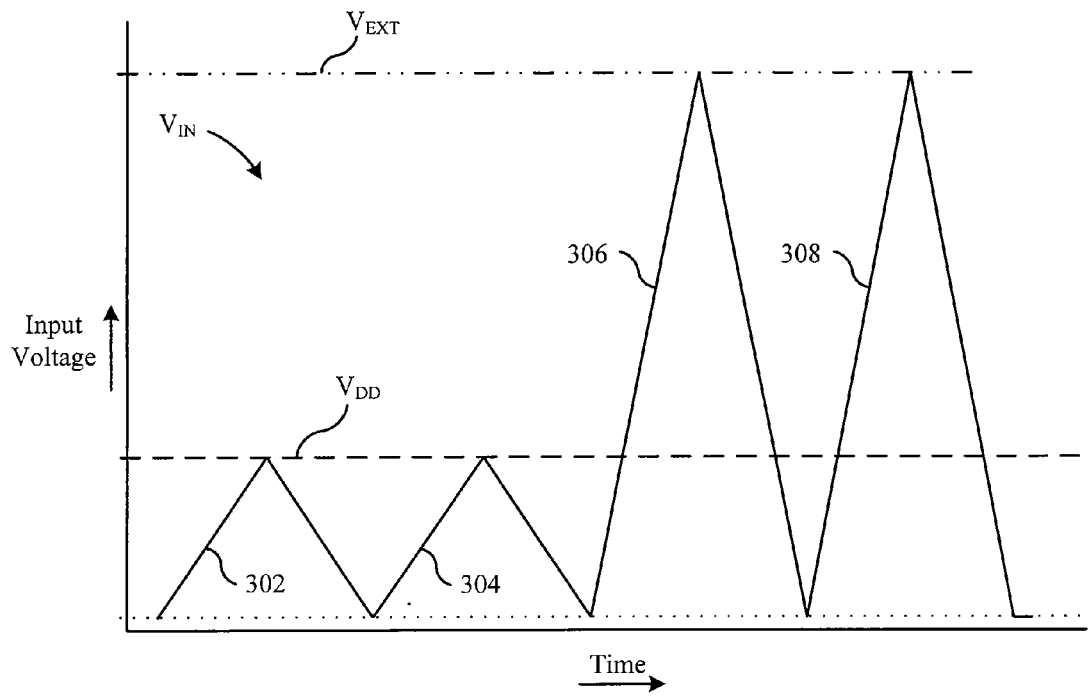
FIG. 3 is a waveform diagram of electrical characteristics of the input circuit of FIG. 1.
Figure 3:
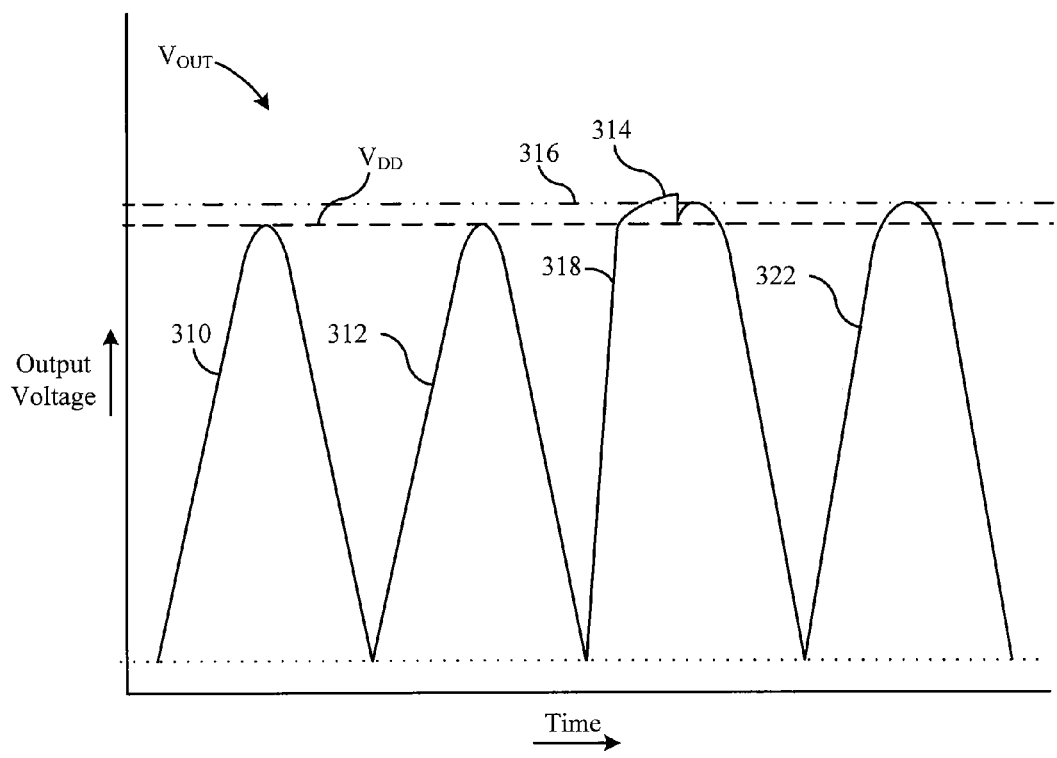

With reference to FIG. 3, external signaling-interface situation where input signal levels received at input pad IN vary between about 0 Volts (V) and about 1.2 V (i.e., corresponding to the supply voltage VDD on the supply-voltage terminal 122). The signaling of FIG. 3 is in general correspondence with the input signaling of FIG. 2 and corresponds in the same manner with the circuit of FIG. 1. As represented in the diagram, for example, a simulated input signal varies at a low rate to indicate a quasi-dc representation of the output response VOUT. Output signal levels are generated at about the same levels at output pad OUT. For example, input voltage VIN includes input pulse 302 and input pulse 304 which are provided through resistor 160 (FIG. 1) to output pad OUT as output voltage VOUT which corresponding includes output pulse 310 and output pulse 312.

Note that the use of the term "pulse" is descriptive of the signal input or output for identification purposes and as noted above, the pulse of FIG. 3 are produce with a low time rate of change. Input pulse 302, input pulse 304, output pulse 310, and output pulse 312 are all operative between, for example, about 0 Volts (V) and the supply voltage VDD of about 1.2 V. Off-set voltage 316, is not of great enough magnitude to cause any reliability problem for any transistor in the circuit. Rather, off-set voltage 316 ensures a linear relationship between VIN and VOUT so as to maintain as close to a 1:1 ratio as possible The linearity in relationship is maintained regardless of whether the operating voltage range of VIN is 0-1.2 V or 0-3.3 V.

With input pulse 306 applied to input pad IN, the voltage on output pad OUT commences to rise as shown in the first portion of output pulse 318. As the voltage on output pad OUT exceeds one NMOS device threshold above ground VSS, transistor 164 is activated and along with transistor 166 provides an activation voltage on the gate terminal of transistor 168 within clamp 162. With transistor 168 activated, as the rising voltage on output pad OUT exceeds one PMOS device threshold above supply voltage VDD, transistor 168 conducts and clamps output voltage VOUT to off-set voltage 316. In the course of activating transistor 164 and transistor 168 a trigger pulse 314 may be experienced as an artifact of the triggering process for these devices.

With the application of input pulse 308 subsequent to input pulse 306, no behavior corresponding to trigger pulse 220 occurs. With the slow rate of change in input conditions of input pulse 308, clamp 162 provides the linear output response at the output pad OUT at the off-set voltage 316. The contiguous rising edge of pulse 322 occurs after latch 146 is triggered and transistor 156 and transistor 158 are activated and corresponds to the discussion above. Off-set voltage 316, is not of great enough magnitude to cause any reliability problem for any transistor in the circuit. Rather, off-set voltage 316 ensures linear relationship between VIN and VOUT is as close to a 1:1 ratio as possible, regardless of whether the operating voltage range of VIN is 0-1.2 V or 0-3.3 V.

Various exemplary embodiments of switches have been given, where a switch has been presented, alternatively, as an NMOS or a PMOS transistor. As one skilled in the art will readily appreciate, further alternative embodiments of switches exist. For example switches within a semiconductor substrate may be fabricated as JFETs or IGFETs transistors for example. The exemplary embodiments referenced above should be incorporated for alternative means for implementing the embodiments and not seen as a restriction to interpretation of the present invention.

What is claimed is:

1. An auto-detecting input circuit disposed between a supply-voltage terminal and a ground terminal, the auto-detecting input circuit comprising:
  a clamp coupled to the supply-voltage terminal and an output pad and configured to electrically couple the output pad to the supply-voltage terminal;
  a detector coupled to an input pad and configured to produce a detection signal;
  a voltage-divider coupled between the input pad and the output pad and configured to translate input voltage levels to output voltage levels; and
  a latch coupled to the voltage-divider and configured to retain a trigger signal;

wherein the detector comprises:
a first transistor with a source terminal coupled to the input pad, a gate terminal coupled to a drain terminal of the first transistor, and a bulk terminal coupled to a floating well; and
a second transistor with a source terminal coupled to the drain terminal of the first transistor, a gate terminal coupled to both an intermediate terminal and a drain terminal of the second transistor, and a bulk terminal coupled to the floating well.

2. The auto-detecting input circuit of claim 1, wherein the detector comprises a bias selector coupled to the input pad, an intermediate terminal, and a well-bias terminal, the bias selector is configured to select a greatest magnitude voltage level present on either the input pad or the intermediate terminal and provide the selected voltage level to the well-bias terminal.

3. The auto-detecting input circuit of claim 1, wherein the voltage-divider comprises:
a resistor with a first current carrying node coupled to the input pad, a second current carrying node coupled to the output pad, and a third terminal coupled to the ground terminal;
a first transistor with a source terminal coupled to the output pad, a gate terminal coupled to an output terminal of the latch, a drain terminal coupled to the ground terminal, and a bulk terminal coupled to the supply-voltage terminal; and
a second transistor with a source terminal and a bulk terminal coupled to the ground terminal, a gate terminal coupled to an output terminal of the latch, and a drain terminal coupled to the output pad;
wherein the voltage-divider is configured to be activated by the trigger signal.

4. The auto-detecting input circuit of claim 1, wherein the clamp circuit comprises:
a first transistor with a source terminal and a bulk terminal coupled to the supply-voltage terminal and a gate terminal coupled to a drain terminal of the first transistor;
a second transistor with a drain terminal coupled to the drain terminal of the first transistor, a gate terminal coupled to the output pad, and a source terminal and a bulk terminal coupled to the ground terminal; and
a third transistor with a first current carrying terminal coupled to the ground terminal, a gate terminal coupled to the drain terminal of the first transistor, a second current carrying terminal coupled to the output pad, and a bulk terminal coupled to the supply-voltage terminal;
wherein the clamp circuit is configured to be activated by an elevated high-logic level on the output pad and to clamp the output pad to an off-set voltage level.

5. The auto-detecting input circuit of claim 1, further comprising a trigger circuit, the trigger circuit comprising:
a first transistor with a source terminal coupled to an intermediate terminal, a gate terminal coupled to the supply-voltage terminal, a bulk terminal coupled to a floating well;
a second transistor with a drain terminal coupled to the drain terminal of the first transistor, a gate terminal coupled to the supply-voltage terminal, a source terminal coupled to a trigger output terminal, and a bulk terminal coupled to the ground terminal; and
a capacitor coupled to the trigger output terminal, and a ground terminal;
wherein the trigger circuit is configured to generate the trigger signal corresponding to the detection signal.

6. The auto-detecting input circuit of claim 1, further comprising a trigger circuit, the trigger circuit comprising a bias selector, the bias selector comprising:
a first transistor with a first current carrying terminal coupled to an intermediate terminal, a gate terminal coupled to the supply-voltage terminal, a second current carrying terminal coupled to a floating well, and a body terminal coupled to the floating well; and
a second transistor with a first current carrying terminal coupled to the floating well, a gate terminal coupled to the intermediate terminal, a second current carrying terminal coupled to the supply-voltage terminal, and a body terminal coupled to the floating well.

7. The auto-detecting input circuit of claim 1, further comprising a trigger circuit, the trigger circuit comprising a bias selector coupled to the supply-voltage terminal, an intermediate terminal, and a floating well, the bias selector configured to select a greatest magnitude voltage level present on either the supply-voltage terminal or the intermediate terminal and provide the selected voltage level to the floating well.

8. The auto-detecting input circuit of claim 1, wherein the latch comprises:
a first inverter with an input terminal coupled to the detector, a first power terminal coupled to the supply-voltage terminal, a second power terminal coupled to the ground terminal, and an output terminal; and
a second inverter with an input terminal coupled to the output terminal of the first inverter, a first power terminal coupled to the supply-voltage terminal, a second power terminal coupled to the ground terminal, and an output terminal coupled to the input terminal of the first inverter;
wherein the first inverter and the second inverter are cross-coupled and configured to be a latch loop.

9. The auto-detecting input circuit of claim 1, further comprising a transistor with a source terminal coupled to an intermediate terminal, a gate terminal and a drain terminal coupled to the supply-voltage terminal, and a bulk terminal coupled to a floating well, the transistor configured to generate a bias level on the intermediate terminal when an elevated input voltage is received on the input pad.

10. An auto-detecting input circuit disposed between a supply-voltage terminal and a ground terminal, the auto-detecting input circuit comprising:
a clamp coupled to the supply-voltage terminal and an output pad and configured to electrically couple the output pad to the supply-voltage terminal;
a detector coupled to an input pad and configured to produce a detection signal;
a voltage-divider coupled between the input pad and the output pad and configured to translate input voltage levels to output voltage levels; and
a latch coupled to the voltage-divider and configured to retain a trigger signal;
wherein the detector comprises a bias selector, the bias selector comprising:
a first transistor with a first current carrying terminal coupled to the input pad, a gate terminal coupled to an intermediate terminal, a second current carrying terminal coupled to a floating well, and a body terminal coupled to the floating well; and
a second transistor with a first current carrying terminal coupled to the floating well, a gate terminal coupled to the input pad, a second current carrying terminal coupled to the intermediate terminal, and a body terminal coupled to the floating well.

* * * * *